(12) United States Patent
Chen et al.

(10) Patent No.: US 11,652,136 B2
(45) Date of Patent: May 16, 2023

(54) SEMICONDUCTOR ARRANGEMENT

(71) Applicant: TAIWAN SEMICONDUCTOR MANUFACTURING COMPANY LIMITED, Hsin-Chu (TW)

(72) Inventors: Huan-Neng Chen, Taichung (TW); Wen-Shiang Liao, Toufen Township (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 2 days.

(21) Appl. No.: 17/135,286

(22) Filed: Dec. 28, 2020

(65) Prior Publication Data
US 2021/0118979 A1 Apr. 22, 2021

Related U.S. Application Data

(62) Division of application No. 16/253,939, filed on Jan. 22, 2019, now Pat. No. 10,879,343.

(60) Provisional application No. 62/753,134, filed on Oct. 31, 2018.

(51) Int. Cl.
| | |
|---|---|
| *H01L 23/522* | (2006.01) |
| *H01L 23/532* | (2006.01) |
| *H01L 21/56* | (2006.01) |
| *H01L 21/768* | (2006.01) |
| *H01L 23/31* | (2006.01) |
| *H01L 49/02* | (2006.01) |

(52) U.S. Cl.
CPC ............ *H01L 28/40* (2013.01); *H01L 21/565* (2013.01); *H01L 21/76802* (2013.01); *H01L 21/76877* (2013.01); *H01L 23/3121* (2013.01); *H01L 23/5223* (2013.01); *H01L 23/5226* (2013.01); *H01L 23/5329* (2013.01)

(58) Field of Classification Search
None
See application file for complete search history.

(56) References Cited

U.S. PATENT DOCUMENTS

| | | | |
|---|---|---|---|
| 9,941,195 B2 | 4/2018 | Liao et al. | |
| 10,269,691 B2 | 4/2019 | Liao et al. | |
| 10,283,443 B2 | 5/2019 | Liao et al. | |
| 10,468,345 B2 | 11/2019 | Liao et al. | |
| 2014/0361403 A1* | 12/2014 | Cho | H01L 27/10894 257/532 |
| 2016/0133686 A1 | 5/2016 | Liao et al. | |
| 2016/0225845 A1* | 8/2016 | Cho | H01L 28/90 |
| 2018/0226329 A1 | 8/2018 | Liao et al. | |
| 2019/0157108 A1* | 5/2019 | Liao | H01L 28/60 |

* cited by examiner

*Primary Examiner* — Telly D Green
(74) *Attorney, Agent, or Firm* — Cooper Legal Group, LLC

(57) ABSTRACT

A semiconductor arrangement is provided. The semiconductor arrangement includes a molding layer and a first capacitor. The first capacitor includes a first vertical conductive structure within the molding layer, a second vertical conductive structure within the molding layer, and a first high-k dielectric material between the first vertical conductive structure and the second vertical conductive structure.

20 Claims, 15 Drawing Sheets

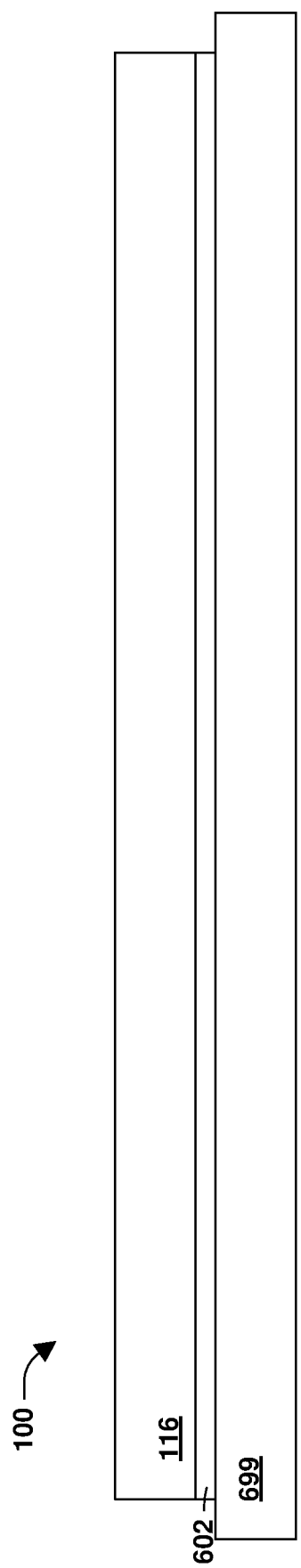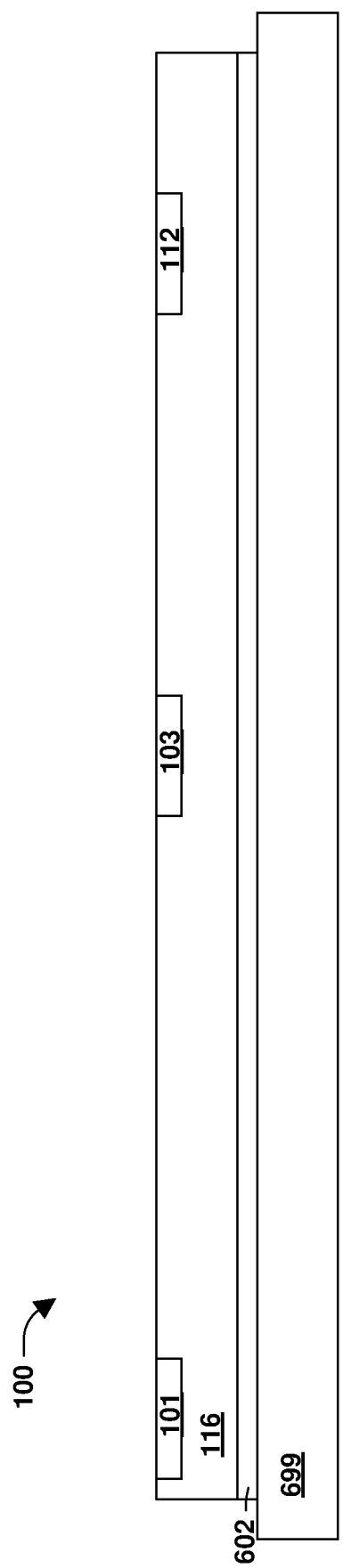

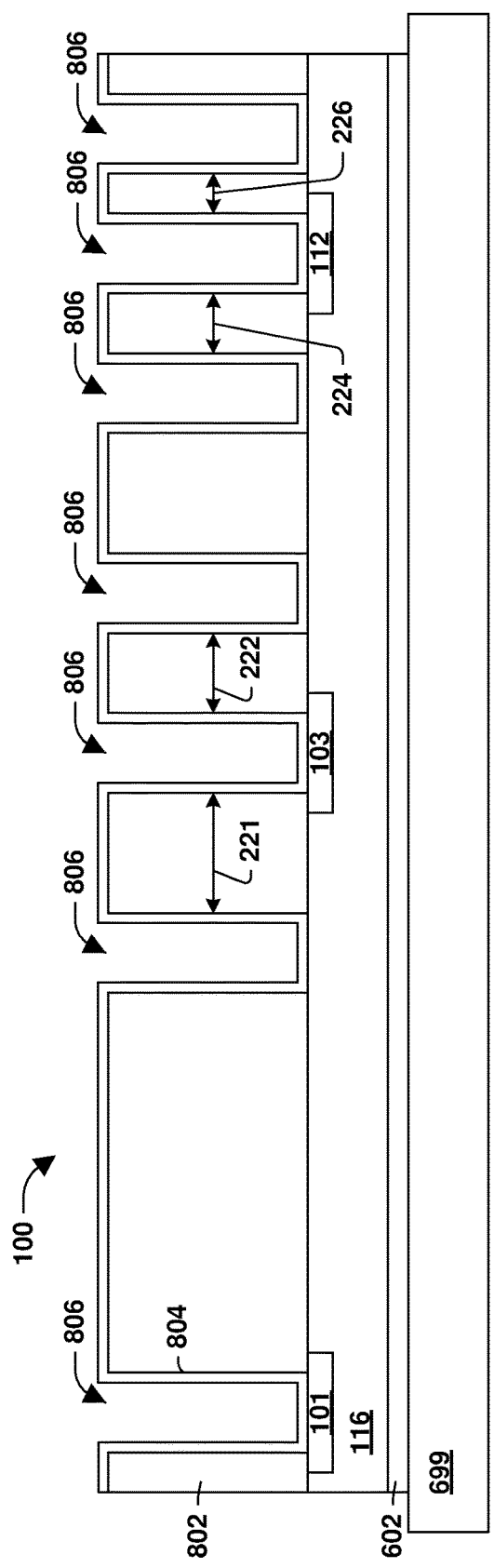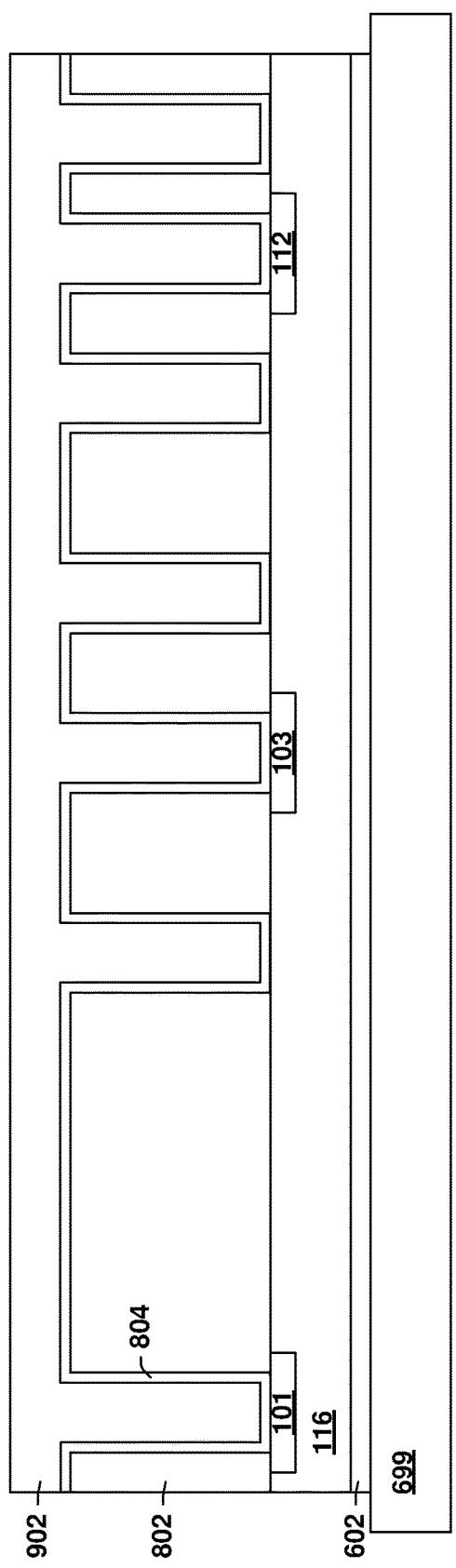

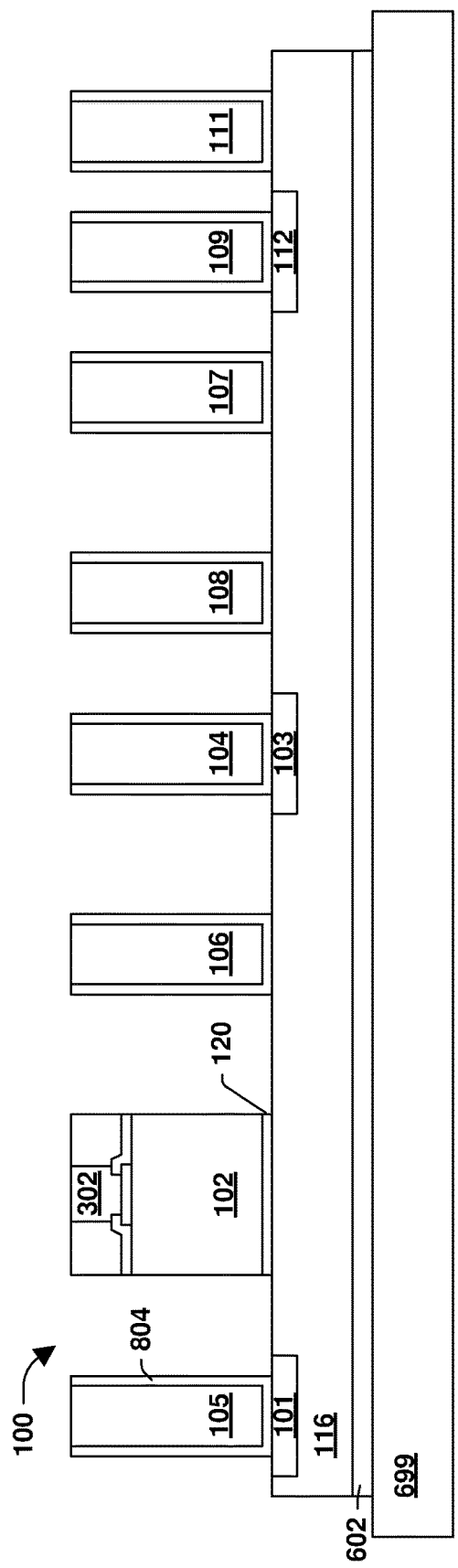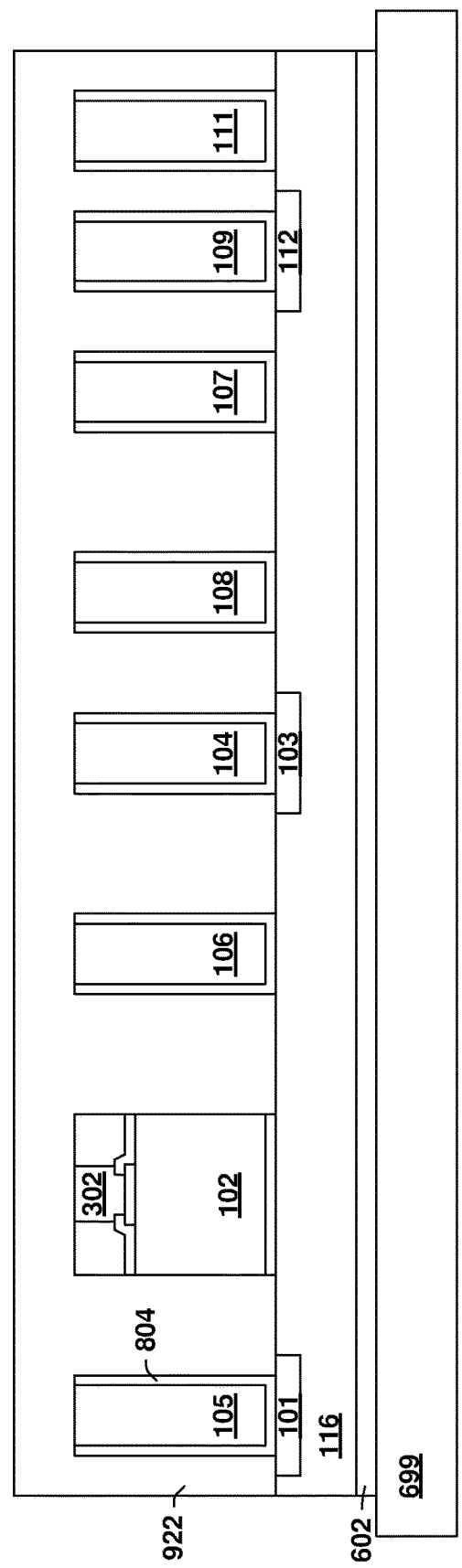

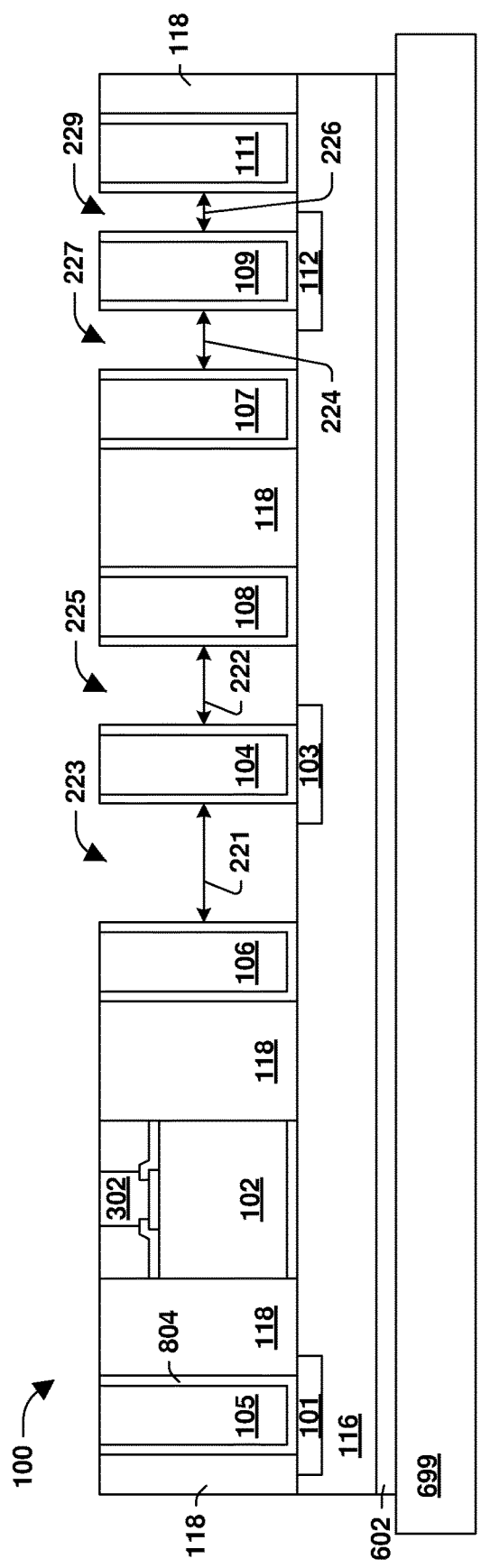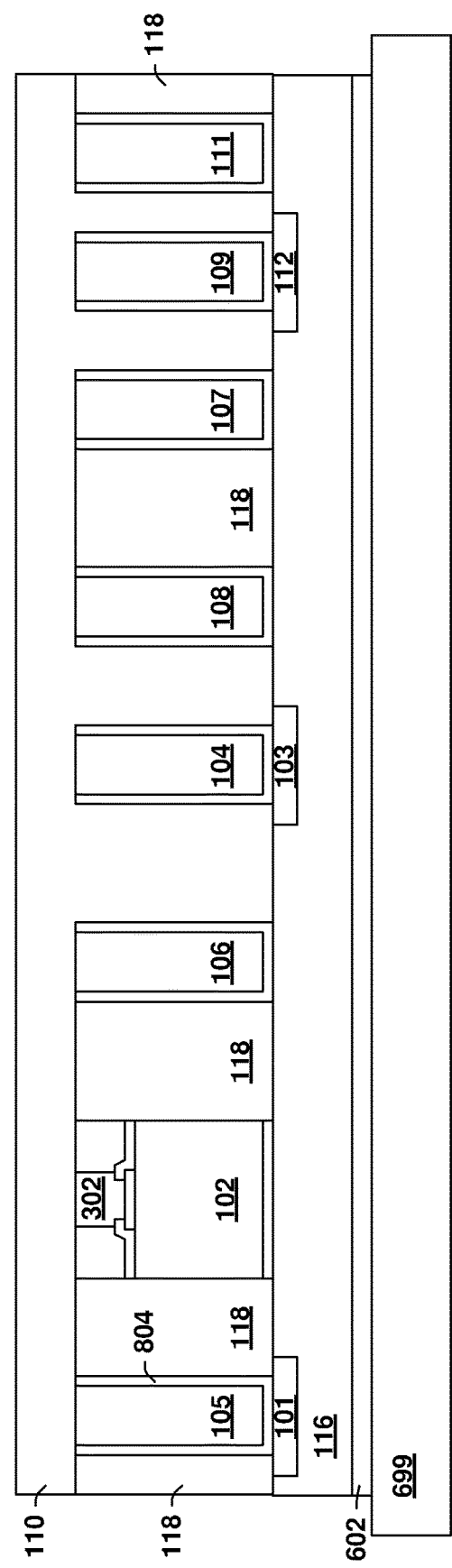
FIG. 11
FIG. 12

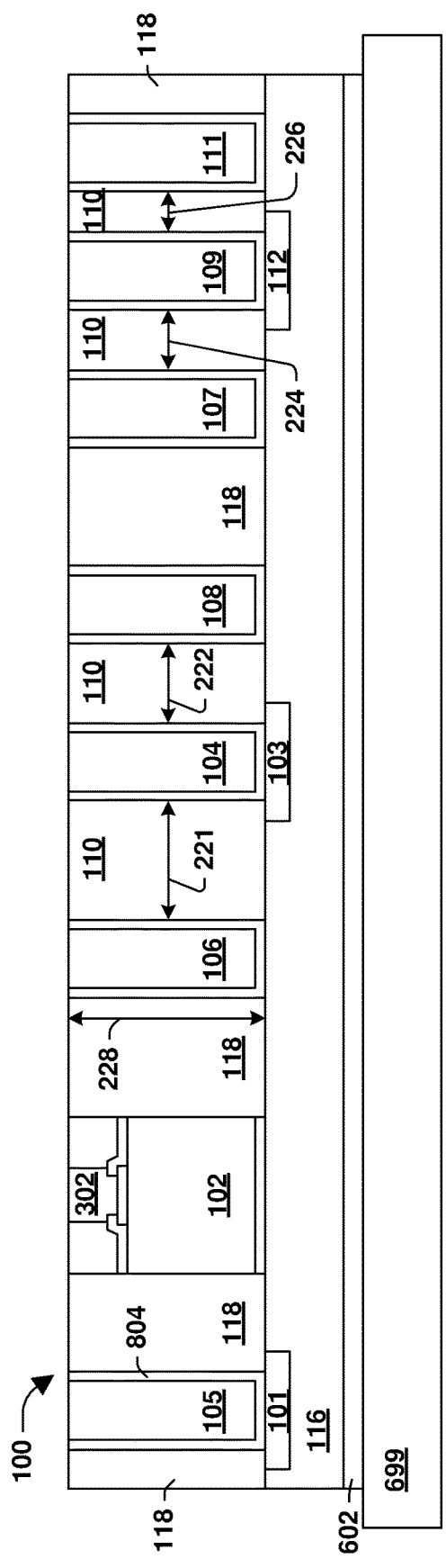
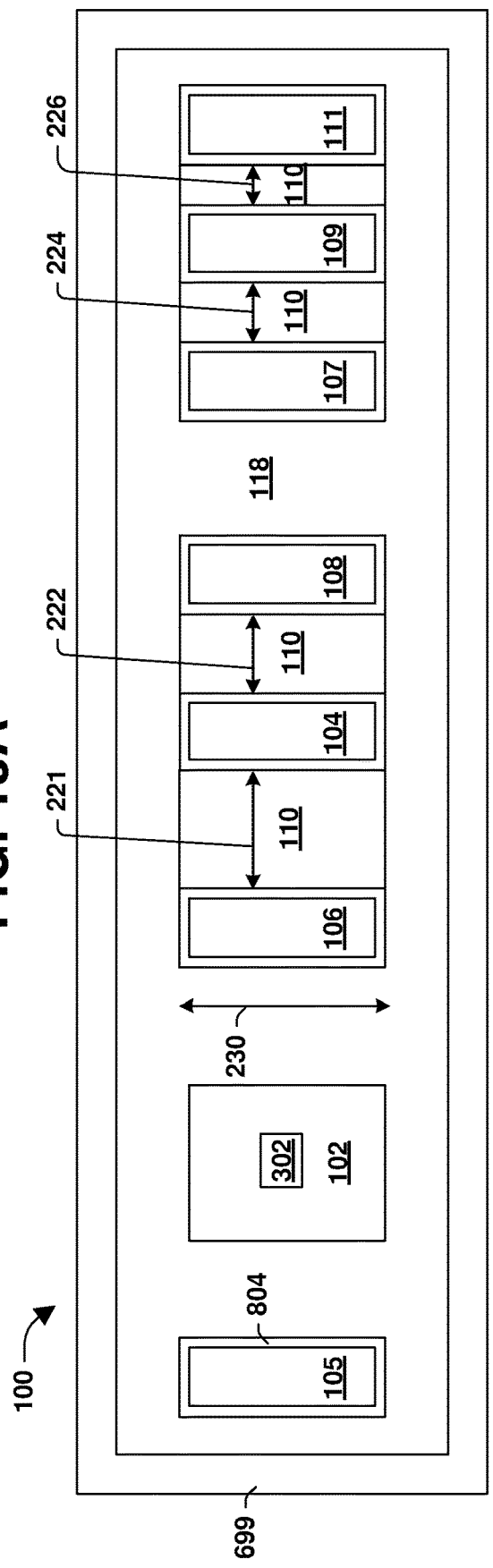
FIG. 13A
FIG. 13B

SEMICONDUCTOR ARRANGEMENT

RELATED APPLICATION

This application is a divisional of U.S. patent application Ser. No. 16/253,939, titled "SEMICONDUCTOR ARRANGEMENT AND METHOD OF MAKING" and filed on filed on Jan. 22, 2019, which claims priority to U.S. Provisional Application 62/753,134, titled "SEMICONDUCTOR ARRANGEMENT AND METHOD OF MAKING" and filed on Oct. 31, 2018. U.S. patent application Ser. No. 16/253,939 and U.S. Provisional Application 62/753,134 are incorporated herein by reference.

BACKGROUND

Semiconductor arrangements are used in a multitude of electronic devices, such as mobile phones, laptops, desktops, tablets, watches, gaming systems, and various other industrial, commercial, and consumer electronics. Semiconductor arrangements generally comprise active components and passive components. Active components include transistors, processors, and memory, while passive components are components, such as capacitors, that affect an operation of an active component.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-13A illustrate cross sectional views of a semiconductor arrangement at various stages of fabrication, in accordance with some embodiments.

FIG. 13B illustrates a top-down view of a semiconductor arrangement during fabrication, in accordance with some embodiments.

DETAILED DESCRIPTION

Figure 5:
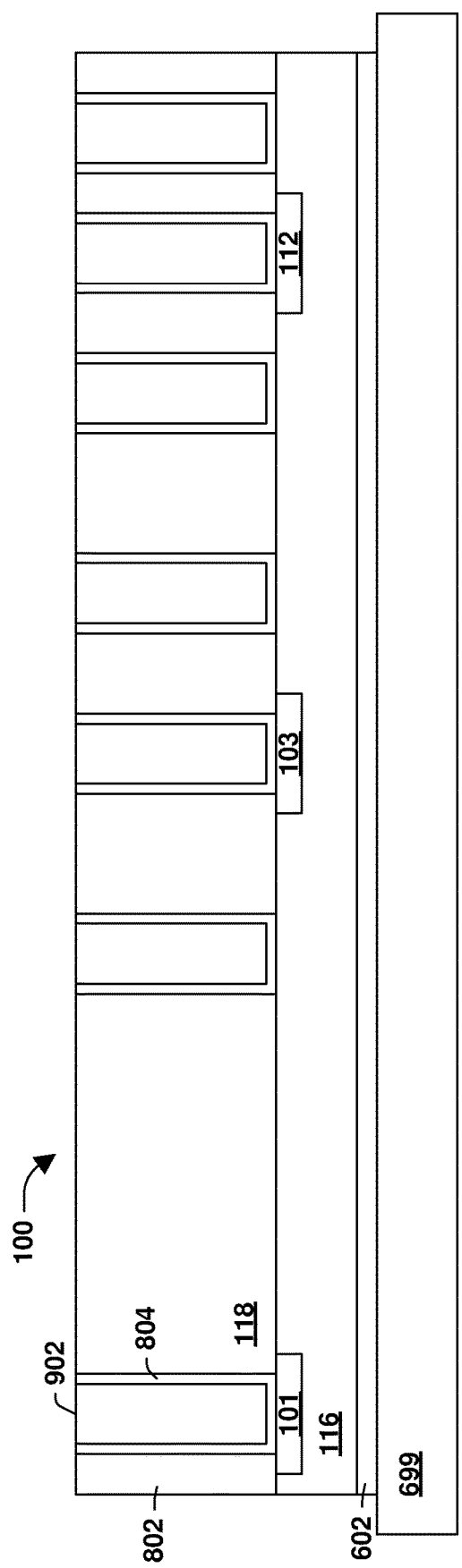

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

Some embodiments relate to a semiconductor arrangement. In accordance with some embodiments, the semiconductor arrangement includes at least two capacitors where a first capacitor and a second capacitor share a vertical conductive structure. A first capacitor includes a first vertical conductive structure and a second vertical conductive structure, with a first dielectric material disposed between the first vertical conductive structure and the second vertical conductive structure. A second capacitor includes the second vertical conductive structure and a third vertical conductive structure, with a second dielectric material disposed between the second vertical conductive structure and the third vertical conductive structure.

According to some embodiments, the first capacitor has a first capacitance based upon a first distance between the first vertical conductive structure and the second vertical conductive structure. According to some embodiments, the first capacitance of the first capacitor is based upon a composition of the first dielectric material. According to some embodiments, the second capacitor has a second capacitance based upon a second distance between the second vertical conductive structure and the third vertical conductive structure. According to some embodiments, the second capacitance of the second capacitor is based upon a composition of the second dielectric material.

According to some embodiments, the first distance is different than the second distance, such that the first capacitance is different than the second capacitance. According to some embodiments, the composition of the first dielectric material is different than the composition of the second dielectric material, such that the first capacitance is different than the second capacitance. According to some embodiments, the first distance is different than the second distance and the composition of the first dielectric material is different than the composition of the second dielectric material, such that the first capacitance is different than the second capacitance. In some embodiments, the second dielectric material is the same as, or has the same composition as, the first dielectric material. In some embodiments, the same composition indicates at least one of the same chemical properties or the same dielectric properties.

FIGS. 1-22 illustrate a semiconductor arrangement 100 at various stages of fabrication, in accordance with some embodiments.

Referring to FIG. 1, an insulator layer 116 is formed, such as deposited, over an intermediate support medium 699, according to some embodiments. In some embodiments, the intermediate support medium 699 comprises glass. In some embodiments, the intermediate support medium 699 is transparent to light. In some embodiments, the intermediate support medium 699 is transparent to light at ultraviolet (UV) wavelengths. In some embodiments, the intermediate support medium 699 functions as a foundation, base, or table to hold the semiconductor arrangement during fabrication stages. In some embodiments, the insulator layer 116 comprises a polymeric material, also referred to herein as a polymer. In some embodiments, the polymer comprises at least one of polybenzobisoxazole (PBO), a polyimide (PI), or other applicable materials. In some embodiments, the polymer is applied using spin coating.

In some embodiments, a thin layer 602 is disposed between the insulator layer 116 and the intermediate support medium 699. In some embodiments, the thin layer 602 comprises a film, such as a light transfer heat conversion (LTHC) layer.

Referring to FIG. 2, one or more conductive elements 101, 103, and 112 are formed in a portion of the insulator layer 116, according to some embodiments. Some embodiments are implemented in which one or more openings are formed, such as etched, in the insulator layer 116, and a seeding layer is formed, such as deposited, in the openings. In some embodiments, the seeding layer comprises a layer of conductive metals. Some embodiments are implemented in which the seeding layer comprises at least one of copper (Cu), titanium (Ti), or other applicable materials. Some embodiments are implemented in which a conductive metal is at least one of grown or deposited over the seeding layer to form the conductive elements 101, 103, and 112. Some embodiments are implemented in which the conductive metal is formed using electrochemical plating (ECP). Although not illustrated, in some embodiments, a topmost surface of one or more of the conductive elements 101, 103, and 112 protrudes above a topmost surface of the insulator layer 116.

Referring to FIG. 3, a photoresist 802 is formed over the insulator layer 116 and patterned to have openings 806. In some embodiments, the photoresist 802 is formed by at least one of spinning, spray coating, or other applicable processes. The photoresist 802 comprises a light sensitive material, where properties, such as solubility, of the photoresist 802 are affected by light. The photoresist 802 is either a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In a positive photoresist, illuminated regions of the positive photoresist become soluble and are removed via application of a solvent during development. Thus, a pattern formed in the positive photoresist is a positive image of opaque regions of the template between the light source and the positive photoresist.

According to some embodiments, a first portion of the patterned photoresist 802 has a first dimension corresponding to a first distance 221, a second portion has a dimension corresponding to a second distance 222, a third portion has a dimension corresponding to a third distance 224, and a fourth portion has a dimension corresponding to a fourth distance 226.

A seeding layer 804 is formed, such as deposited, over the photoresist 802, according to some embodiments. The seeding layer 804 comprises a layer of one or more conductive metals, such as copper or titanium. In some embodiments, the seeding layer 804 conforms to a contour of the photoresist 802.

Referring to FIG. 4, a conductive material 902 is formed, such as deposited, over the seeding layer 804, according to some embodiments. The conductive material 902 comprises a metal such as copper. Some embodiments are implemented in which the conductive material 902 is deposited using ECP.

Referring to FIG. 5, portions of the conductive material 902 and the seeding layer 804 overlying the photoresist 802 are removed, such as by chemical-mechanical polishing (CMP), in some embodiments.

Figure 6:
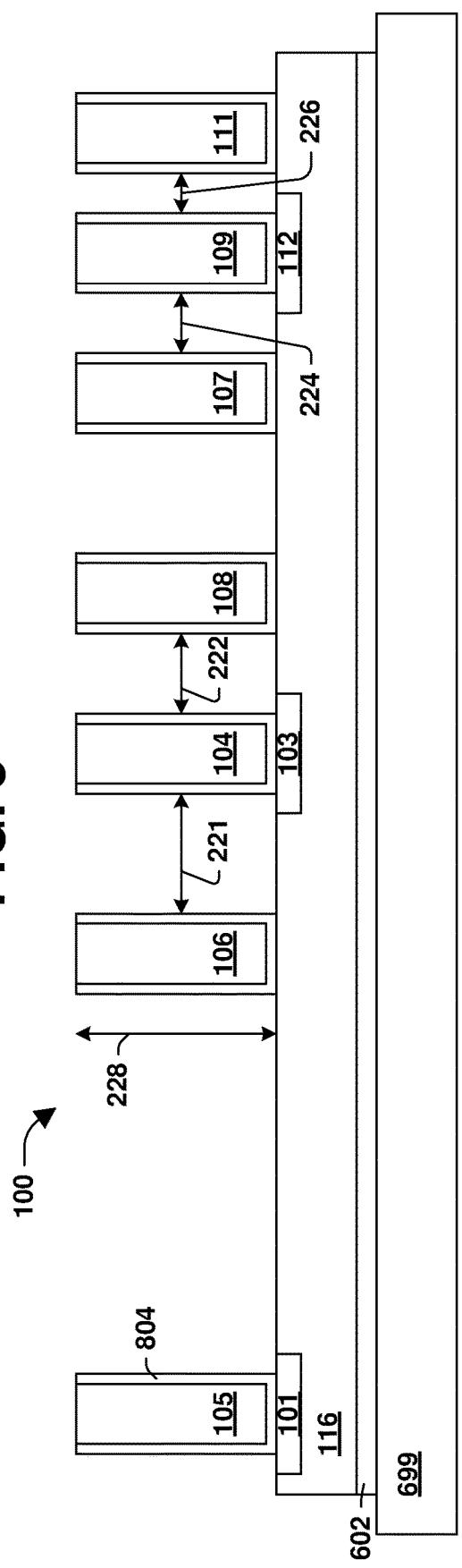

Referring to FIG. 6, the photoresist 802 is removed, such as by stripping, according to some embodiments. After the photoresist 802 and the portions of the conductive material 902 and the seeding layer 804 overlying the photoresist 802 are removed, one or more vertical conductive structures 104, 105, 106, 107, 108, 109, and 111 remain over the insulator layer 116. In some embodiments, residual seeding layer 804 is on at least one of a sidewall or a bottom surface of at least one of the vertical conductive structures 104, 105, 106, 107, 108, 109, or 111.

According to some embodiments, respective heights of vertical conductive structures vary so that a height of one vertical conductive structure is different than a height of a different vertical conductive structure, where height is measured in a direction indicated by arrow 228. According to some embodiments, respective heights of vertical conductive structures are varied by at least one of altering a height or uniformity of the photoresist 802 and thus a depth of at least one of the openings 806, controlling an amount of the conductive material 902 filled into at least one of the openings 806, or controlling an amount of the conductive material 902 removed from at least one of the openings 806. According to some embodiments, respective thicknesses of vertical conductive structures vary so that a thickness of one vertical conductive structure is different than a thickness of a different vertical conductive structure, where thickness is measured in a direction indicated by one or more of the arrows indicating distances 221, 222, 224, 226. According to some embodiments, respective thicknesses of vertical conductive structures are varied by at least one of altering a thickness or width of at least one of the openings 806, controlling an amount of the conductive material 902 filled into at least one of the openings 806, or controlling an amount of the conductive material 902 removed from at least one of the openings 806.

Referring to FIG. 7, an active device 102 is formed over the insulator layer 116 between vertical conductive structures 105 and 106. A conductive pad 302 is formed in or on the active device 102 so as to be electrically coupled to an internal component (not shown) of the active device 102. In some embodiments, the active device 102 is attached to the insulator layer 116 with a die attach film 120 disposed between a bottom surface of the active device 102 and the insulator layer 116. In some embodiments, the active device 102 comprises a known good die (KGD) cut from a semiconductor wafer. Some embodiments are implemented in which the active device 102 is selected using a pick and place technique from among a batch of devices that have been tested and identified as KGDs.

Referring to FIG. 8, a molding compound 922 is formed, such as deposited, over the active device 102, the vertical conductive structures 104, 105, 106, 107, 108, 109, and 111, and exposed portions of the insulator layer 116. In some embodiments, the molding compound 922 comprises a polymeric material. The molding compound 922 electrically insulates the active device 102 and the vertical conductive structures 104, 105, 106, 107, 108, 109, and 111 from one another. In some embodiments, the molding compound 922 is deposited in a liquid state and then cured to solidify the molding compound 922.

Figure 9:
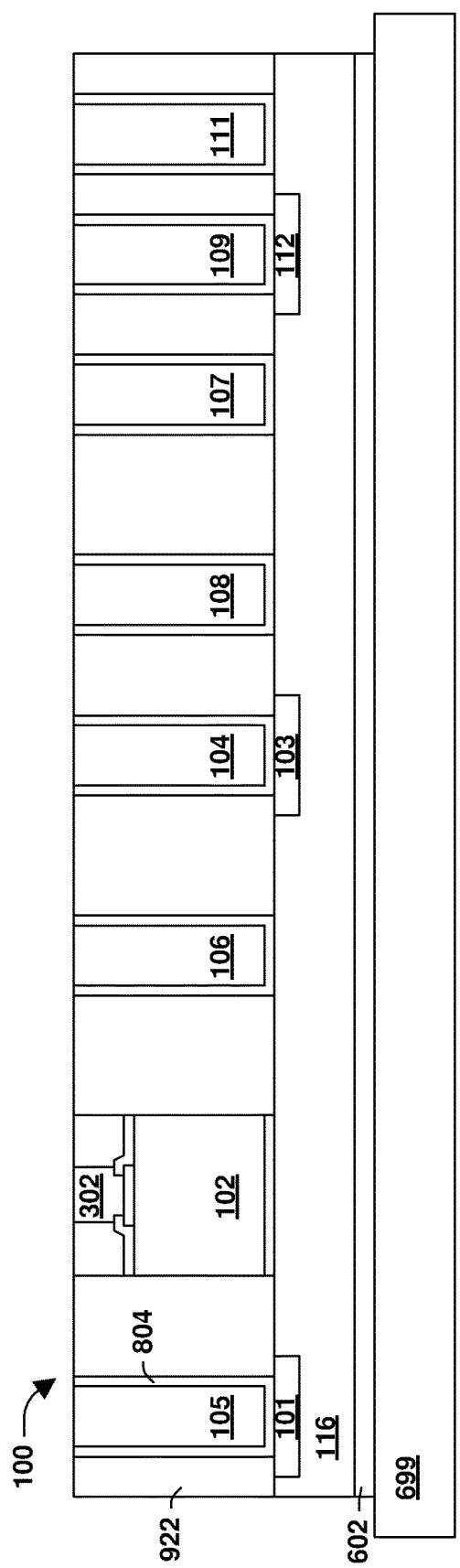

Referring to FIG. 9, excess molding compound 922 is removed to expose upper surfaces of at least one of the active device 102, the conductive pad 302, or at least one of the vertical conductive structures 104, 105, 106, 107, 108, 109, or 111. In some embodiments the excess molding compound 922 is removed using at least one of CMP, grinding, or other applicable processes.

Figure 10:
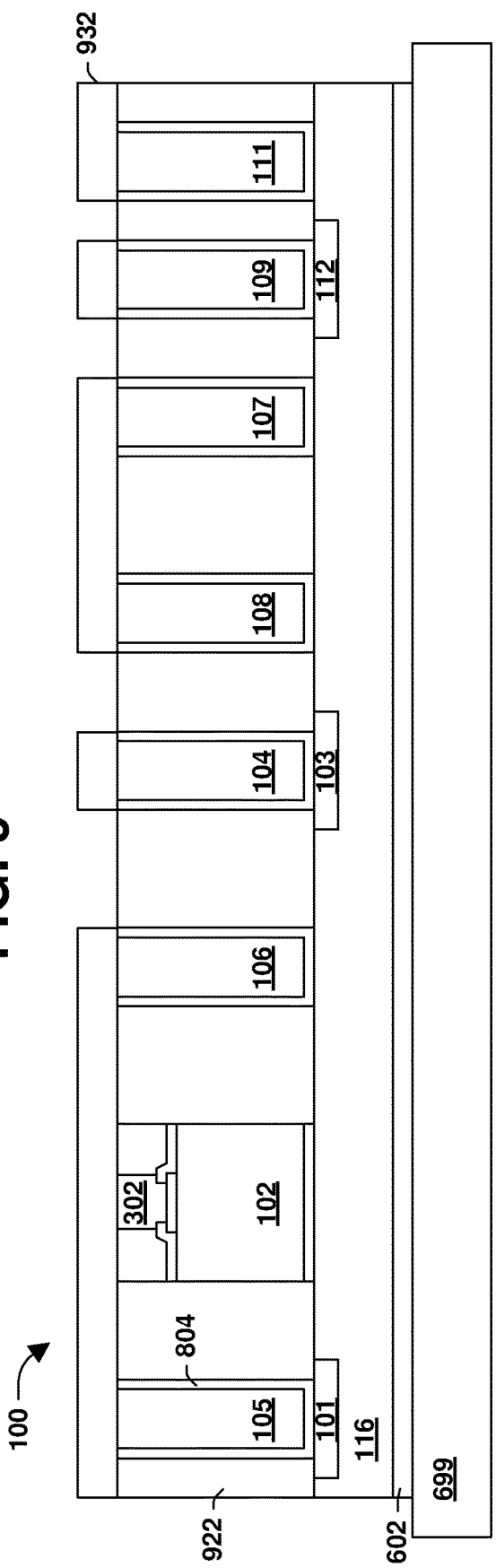

Referring to FIG. 10, a photoresist 932 is formed and patterned to expose portions of the molding compound 922 between the vertical conductive structure 104 and the vertical conductive structure 106, between the vertical conductive structure 104 and the vertical conductive structure 108, between the vertical conductive structure 109 and the vertical conductive structure 107, and between the vertical conductive structure 109 and the vertical conductive structure 111.

Referring to FIG. 11, the exposed portions of the molding compound 922 are removed to establish a first opening 223 between the vertical conductive structure 104 and the vertical conductive structure 106, a second opening 225 between the vertical conductive structure 104 and the vertical conductive structure 108, a third opening 227 between the vertical conductive structure 107 and the vertical conductive structure 109, and a fourth opening 229 between vertical conductive structure 109 and the vertical conductive structure 111. The patterned photoresist 932 is then removed. In some embodiments, an etching process is used to remove the exposed portions of the molding compound 922 with the patterned photoresist 932, while other portions of the molding compound 922 are protected from being removed during the etching process. The first opening 223 has a dimension corresponding to the first distance 221, the second opening 225 has a dimension corresponding to the second distance 222, the third opening 227 has a dimension corresponding to the third distance 224, and the fourth opening 229 has a dimension corresponding to the fourth distance 226. Remaining portions of the molding compound 922 are regarded as a molding layer 118, according to some embodiments.

Referring to FIG. 12, a dielectric material 110 is formed, such as deposited, over the molding layer 118, the active device 102, the vertical conductive structures 104, 105, 106, 107, 109, and 111, and at least one exposed portion of the insulator layer 116.

In some embodiments, different dielectric materials are applied so that at least two of the openings 223, 225, 227, or 229 do not have the same dielectric material. In some embodiments, a first patterned photoresist (not shown) covers the first opening 223 while a first dielectric material is applied so that little to none of the first dielectric material enters the first opening 223 but does enter at least one of the other openings, such as the second opening 225. The first patterned photoresist can then by removed and a second dielectric material can be applied to fill the second opening 225. The second dielectric material does enter the first opening 223 due to the presence of the first dielectric material in the first opening 223. In some embodiments, at least one of additional photoresists or additional dielectric materials are implemented.

In some embodiments, at least one of the dielectric materials comprises a polymer. In some embodiments, at least one of the dielectric materials comprises at least one of PBO, PI, or other applicable materials. Some embodiments are implemented in which at least one of the dielectric materials comprises a polymer that is deposited and cured over a temperature of approximately 25 degrees Celsius (approx. 25° C.). The depositing and curing of the polymer at approx. 25° C. may promote relaxed, well matched, low stress curing of the dielectric.

In some embodiments, at least one of the dielectric materials comprises silicon dioxide ($SiO_2$), Spin-on-Glass (SOG), or other applicable materials. Some embodiments are implemented in which at least one of the dielectric materials is deposited and cured to a hardened state over a temperature lower than 250° C.

In some embodiments, at least one of the dielectric materials comprises a nitride of silicon ($SiN_x$), silicon oxynitride ($SiO_xN_y$), or other applicable materials, where x and y are both positive integers. In some embodiments, solvent associated with the dielectric material, such as $SiN_x$, is removed with evaporation from the dielectric material as the dielectric material cures.

Some embodiments are implemented in which at least one of the dielectric materials is deposited using chemical vapor deposition (CVD) or other applicable processes. Some embodiments are implemented in which at least one of the dielectric materials comprises CVD-deposited $SiO_2$.

Some embodiments are implemented in which at least one of the dielectric materials is deposited using at least one of Atmospheric Pressure CVD (APCVD), Sub-Atmospheric [pressure] CVD (SACVD), Plasma Enhanced CVD (PECVD), Metal-Organic CVD (MOCVD), or other applicable processes. Some embodiments are implemented in which at least one of the dielectric materials is deposited over a temperature of approx. 180° C.

In some embodiments, at least one of the dielectric materials comprises zirconium dioxide-aluminum oxide-zirconium dioxide ($ZrO_2$—$Al_2O_3$—$ZrO_2$, at times referred to as 'ZAZ'). In some embodiments, at least one of the dielectric materials comprises at least one of zirconium dioxide ($ZrO_2$), aluminum oxide ($Al_2O_3$), an oxide of hafnium ($HfO_x$), a hafnium silicon oxide ($HfSiO_x$), a zirconium titanate ($ZrTiO_x$), titanium dioxide ($TiO_2$), an oxide of tantalum ($TaO_x$), or other applicable materials, where x is a positive integer. In some embodiments, at least one of the dielectric materials comprise at least one of an oxide or nitride of a metal, metalloid, element, compound, or substance. Some embodiments are implemented in which at least one of the dielectric materials is deposited over a temperature of approx. 210° C.

In some embodiments, at least one of the dielectric materials comprises at least one of $TiO_2$, strontium titanate ($SrTiO_3$, 'STO'), barium titanate ($BaTiO_3$, at times referred to as 'BTO'), barium strontium titanate ($BaSrTiO_3$, at times referred to as 'BST'), or lead zirconium titanate ($PbZrTiO_3$, at times referred to as 'PZT'), or other applicable materials. In some embodiments, at least one of the dielectric materials comprises a titanate.

In some embodiments, at least one of the dielectric materials comprises a high-k dielectric material. According to some embodiments, the high-k dielectric material has a dielectric constant, k, greater than 3.9. According to some embodiments, the high-k dielectric material comprises at least one of Al2O3, HfO2, ZrO2, La2O3, TiO2, SrTiO3, LaAlO3, Y2O3, Al2OxNy, HfOxNy, ZrOxNy, La2OxNy, TiOxNy, SrTiOxNy, LaAlOxNy, Y2OxNy, SiON, or SiNx. According to some embodiments, x is from 0.5 to 3. According to some embodiments, y is from 0 to 2.

Some embodiments are implemented in which an E-gun is used to deposit at least one of the dielectric materials. Some embodiments are implemented in which at least one of the dielectric materials is deposited over a temperature below 200° C. Some embodiments are implemented in which Laser-CVD is used to deposit at least one of the dielectric materials over a temperature below 200° C.

Some embodiments are implemented in which at least one of the dielectric materials is deposited using a liquid phase paste. Upon the deposition of the liquid phase paste, deposited material of at least one of the dielectric materials is cured and hardened.

According to some embodiments, at least one of the dielectric materials comprises a molding material, such as the molding compound 922 or other applicable materials. According to some embodiments, one or more of the openings 223, 225, 227, or 229 are not formed such that the molding layer 118 remains between at least some of the vertical conductive structures 104, 106, 108, 107, 109, or 111 as the dielectric material 110. According to some embodiments, the photoresist 932 described with respect to FIG. 10 is omitted if none of the openings 223, 225, 227, or 229 are formed such that the molding layer 118 remains between all of the vertical conductive structures 104, 106, 108, 107, 109, and 111 as the dielectric material 110.

Referring to FIG. 13A, excess dielectric material is removed to expose upper surfaces of at least one of the molding layer 118, the active device 102, or at least one of the vertical conductive structures 104, 105, 106, 107, 108, 109, or 111, according to some embodiments. In some embodiments the excess dielectric material is removed using at least one of CMP, grinding, or other applicable processes. A thickness of dielectric material between two adjacent vertical conductive structures corresponds to a distance between the two adjacent vertical conductive structures, such as distances 221, 222, 224, 226.

In some embodiments, at least one of the openings 223, 225, 227, or 229 is not entirely filled with dielectric material. In some embodiments, an uppermost surface of at least some dielectric material between two adjacent vertical conductive structures is below an uppermost surface of at least one of the two adjacent vertical conductive structures. According to some embodiments, a height of dielectric material between two adjacent vertical conductive structures is less than a height of at least one of the two adjacent vertical conductive structures, where height is measured in the direction indicated by arrow 228. According to some embodiments, respective heights of dielectric material between two adjacent vertical conductive structures vary so that a height of a first instance of dielectric material is different than a height of a second instance of dielectric material. According to some embodiments, respective heights of instances of dielectric material are varied by at least one of altering a depth of at least one of the openings 223, 225, 227, or 229, controlling an amount of the dielectric material 110 filled into at least one of the openings 223, 225, 227, or 229, or controlling an amount of the dielectric material 110 removed from at least one of the openings 223, 225, 227, or 229. In some embodiments, space between two adjacent vertical conductive structures is not entirely filled with dielectric material 110.

In some embodiments, a passivation process is performed to form, such as grow, a thin layer of passivation material (not shown), such as an oxide or nitride, over the upper surface of at least one of the dielectric material 110, the molding layer 118, the active device 102, or at least one of the vertical conductive structures 104, 105, 106, 107, 108, 109, or 111. In some embodiments, the layer of passivation material is patterned so as to remain over one or more, but not all, of the dielectric material 110, the molding layer 118, the active device 102, or at least one of the vertical conductive structures 104, 105, 106, 107, 108, 109, or 111.

FIG. 13B illustrates a top down view of the semiconductor arrangement at the stage of fabrication illustrated in FIG. 13A. A length of elements is illustrated in FIG. 13B, where length is measured in a direction indicated by arrow 230. The length would be into and out of the page in FIG. 13A. In some embodiments, respective lengths of vertical conductive structures vary so that a length of one vertical conductive structure is different than a length of a different vertical conductive structure. According to some embodiments, respective lengths of vertical conductive structures are varied by at least one of altering a length of at least one of the openings 806, controlling an amount of the conductive material 902 filled into at least one of the openings 806, or controlling an amount of the conductive material 902 removed from at least one of the openings 806.

According to some embodiments, respective lengths of dielectric material between two adjacent vertical conductive structures vary so that a length of a first instance of dielectric material is different than a length of a second instance of dielectric material. According to some embodiments, respective lengths of instances of dielectric material are varied by at least one of altering a length of at least one of the openings 223, 225, 227, or 229, controlling an amount of the dielectric material 110 filled into at least one of the openings 223, 225, 227, or 229, or controlling an amount of the dielectric material 110 removed from at least one of the openings 223, 225, 227, or 229. According to some embodiments, the molding layer 118 contacts at least one of the vertical conductive structures. According to some embodiments, the molding layer 118 contacts at least some dielectric material between two adjacent vertical conductive structures.

According to some embodiments, a vertical conductive structure is a vertical conductive plate. According to some embodiments, a dimension of a vertical conductive plate in a direction indicated by arrow 230 is greater than a dimension of the vertical conductive plate in a direction indicated by one or more of the arrows 221, 222, 224, 226. According to some embodiments, the vertical conductive structure is in a via layer of the semiconductor arrangement 100. According to some embodiments, one or more instances of the dielectric material 110 between the vertical conductive structures 104, 106, 108, 107, 109, and 111 are replaced by one or more instances of the molding layer 118 such that the molding layer 118 is between at least two of the vertical conductive structures 104, 106, 108, 107, 109, or 111. According to some embodiments, an instance of the molding layer 118 between two of vertical conductive structures serves as the dialectic of a capacitor comprising the two of vertical conductive structures.

Figure 14:
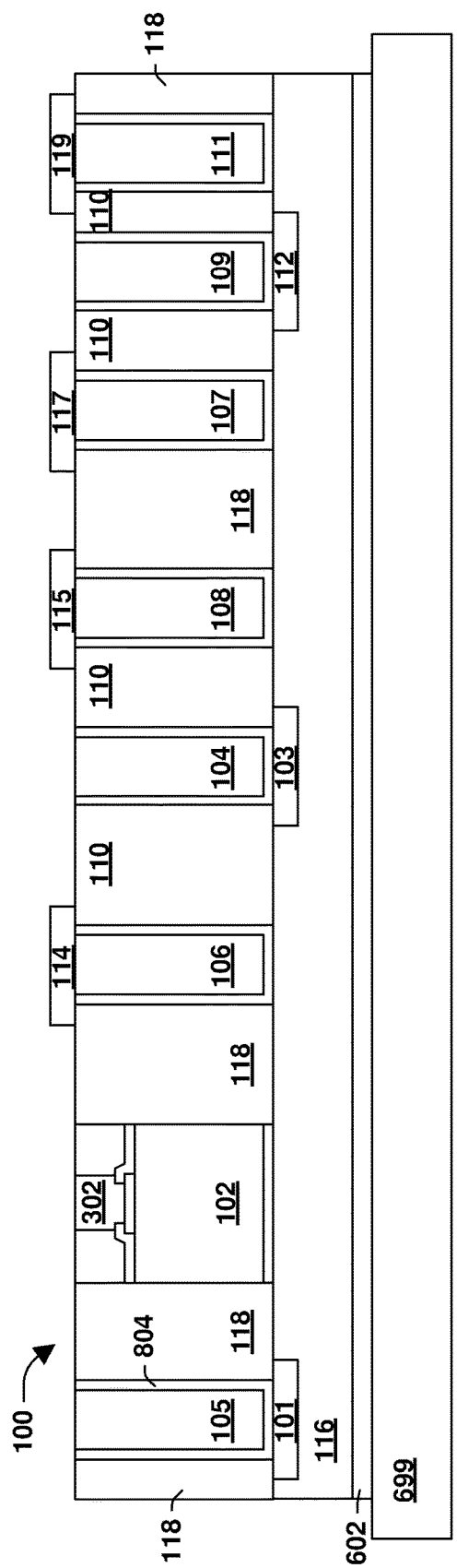
FIGS. 14-22 illustrate cross sectional views of a semiconductor arrangement at various stages of fabrication, in accordance with some embodiments.

Referring to FIG. 14, conductive elements 114, 115, 117, and 119 are formed over the vertical conductive structures 106, 108, 107, and 111. In some embodiments, a layer of conductive material is formed, such as deposited, and patterned, such as using a photoresist, to form the conductive elements 114, 115, 117, and 119. In some embodiments, the layer of conductive material comprises a metal, such as copper or other applicable materials. Some embodiments are implemented in which the layer of conductive material is deposited with ECP or other applicable processes. In some embodiments, the layer of conductive material defines a redistribution layer (RDL).

Figure 15:
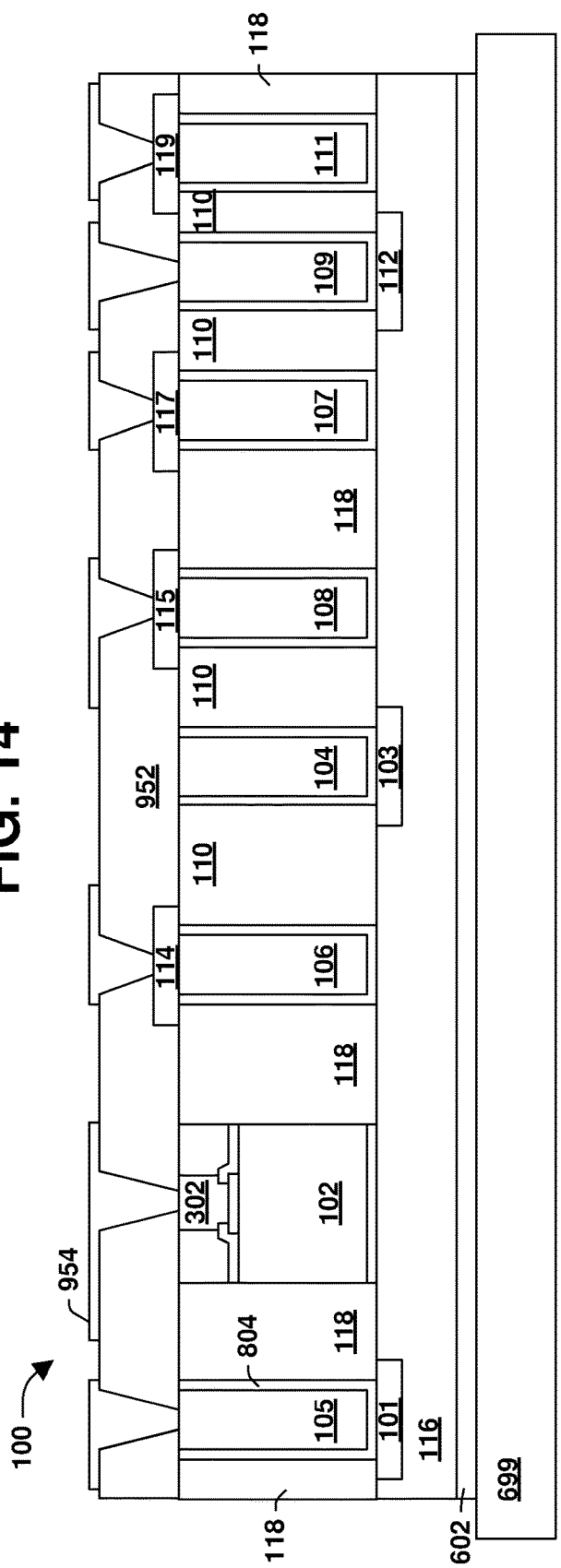

Referring to FIG. 15, an insulator layer 952 is formed, such as deposited, over the dielectric material 110, the molding layer 118, the active device 102, at least one of the conductive elements 114, 115, 117, or 119, and at least one of the vertical conductive structures 104, 105, 106, 107, 108, 109, or 111. Some embodiments are implemented in which the insulator layer 952 comprises a polymeric material or other applicable materials. Some embodiments are implemented in which the insulator layer 952 comprises PBO. Some embodiments are implemented in which the insulator layer 952 comprises a PI.

In some embodiments, the insulator layer 952 is patterned, such as using a photoresist, to form openings that expose the vertical conductive structures 105, 109, the conductive elements 114, 115, 117, and 119, and the conductive pad 302. In some embodiments, a layer of conductive material is formed, such as deposited, over the insulator layer 952. The layer of conductive material is patterned, such as using a photoresist, to form conductive elements 954. In some embodiments, the layer of conductive material comprises a metal such as copper or other applicable materials. Some embodiments are implemented in which the layer of conductive material is deposited with ECP or other applicable processes. In some embodiments, the layer of conductive elements 954 are part of a redistribution layer.

In some embodiments, forming the conductive elements 954 comprises forming a seeding layer (now shown) over inner surfaces or sidewalls that define the openings that expose the vertical conductive structures 105 and 109, the conductive elements 114, 115, 117, and 119, and the conductive pad 302. In some embodiments, the seeding layer comprises a metal. In some embodiments, the seeding layer comprises at least one of copper, titanium, or other applicable materials.

Figure 16:
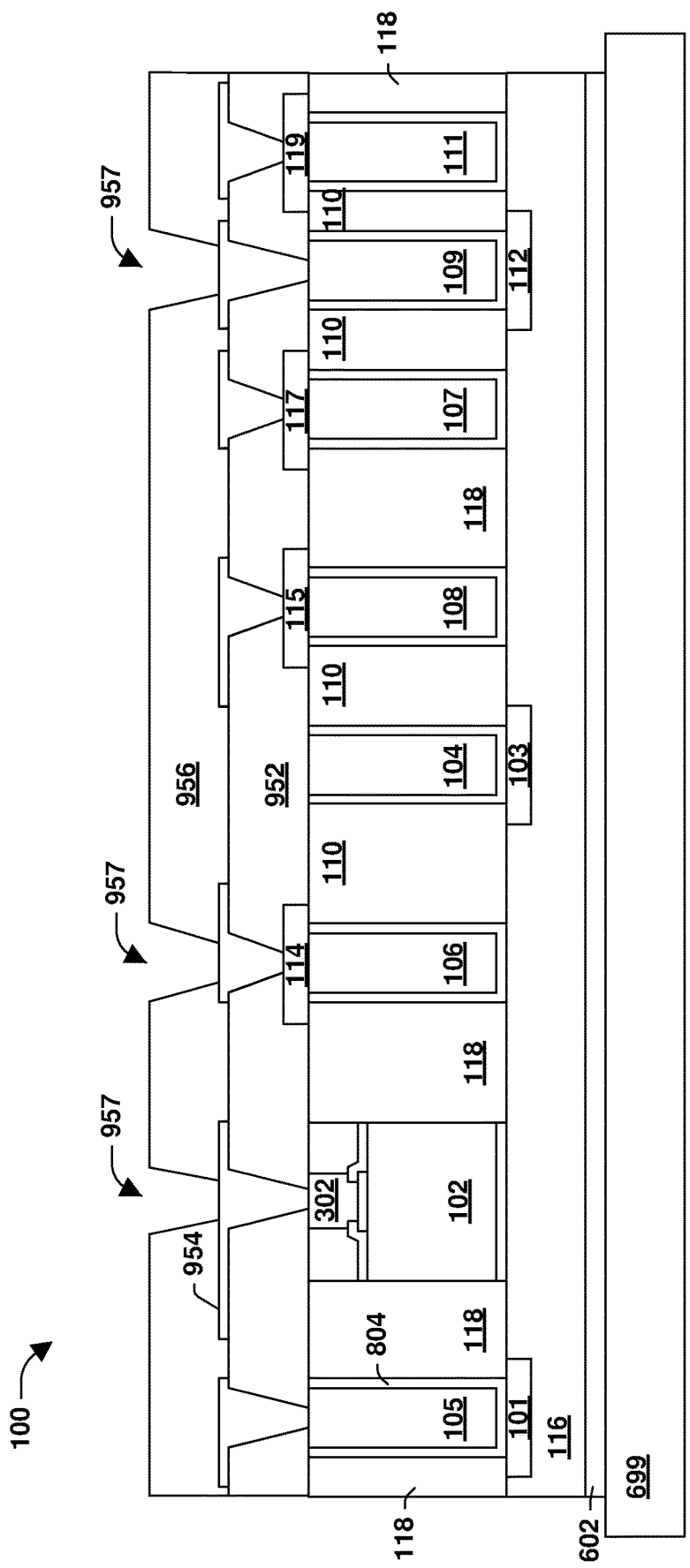

Referring to FIG. 16, an insulator layer 956 is formed, such as deposited, over the conductive elements 954 and exposed portions of the insulator layer 952. Some embodiments are implemented in which the insulator layer 956 comprises a polymeric material or other applicable materials. Some embodiments are implemented in which the insulator layer 956 comprises a PI. Some embodiments are implemented in which the insulator layer 956 comprises PBO.

In some embodiments, the insulator layer 956 is patterned, such as with a photoresist, to form openings 957 that align with at least some of the openings in the insulator layer 952 in which the conductive elements 954 are formed. In some embodiments, the openings 957 expose the conductive pad 302, the conductive element 114, and the vertical conductive structure 109.

Figure 17:
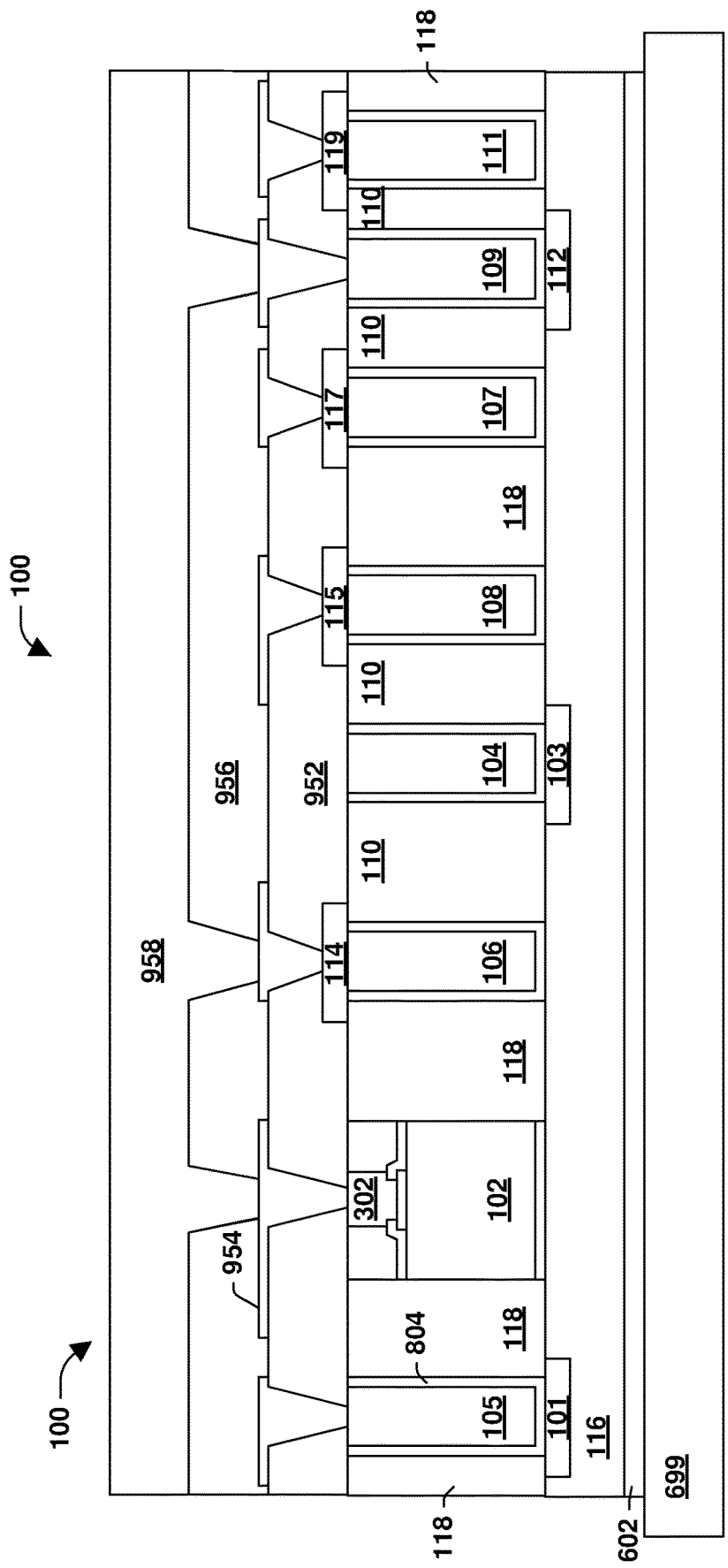

Referring to FIG. 17, a layer of conductive material 958 is formed, such as deposited, over the insulator layer 956. In some embodiments, portions of the conductive material 958 contact conductive elements overlying the conductive pad 302, conductive element 114, and vertical conductive structure 109.

In some embodiments, the layer of conductive material 958 comprises a metal such as copper or other applicable materials. Some embodiments are implemented in which the layer of conductive material 958 is deposited with ECP or other applicable processes. In some embodiments, the deposited conductive material 958 defines a redistribution layer.

Figure 18:
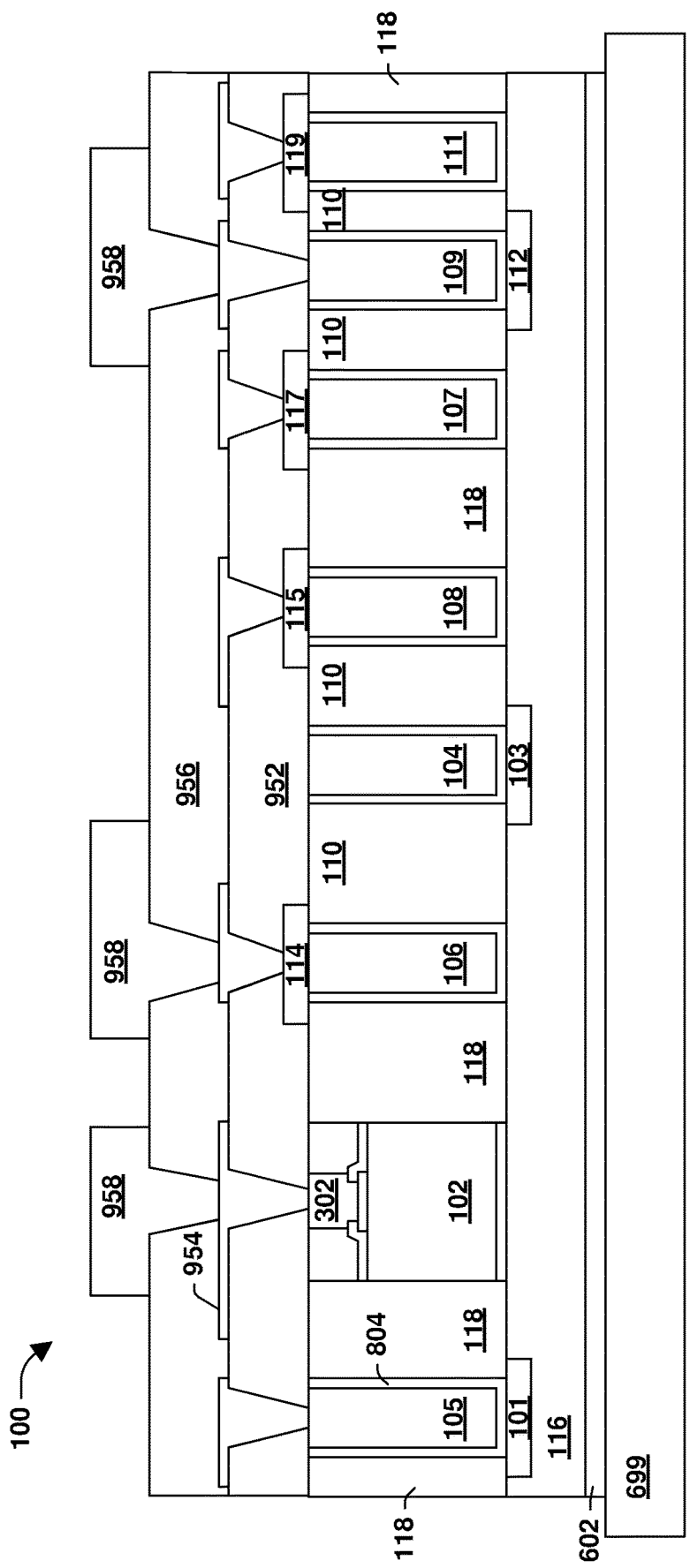

Referring to FIG. 18, the layer of conductive material 958 is patterned, such as with a photoresist. In some embodiments, the layer of conductive material 958 is patterned using wet acid etching or other applicable processes. In some embodiments, the layer of conductive material 958 is patterned to have a first portion electrically coupled to conductive pad 302, a second portion electrically coupled to conductive element 114, and a third portion electrically coupled to vertical conductive structure 109.

Figure 19:
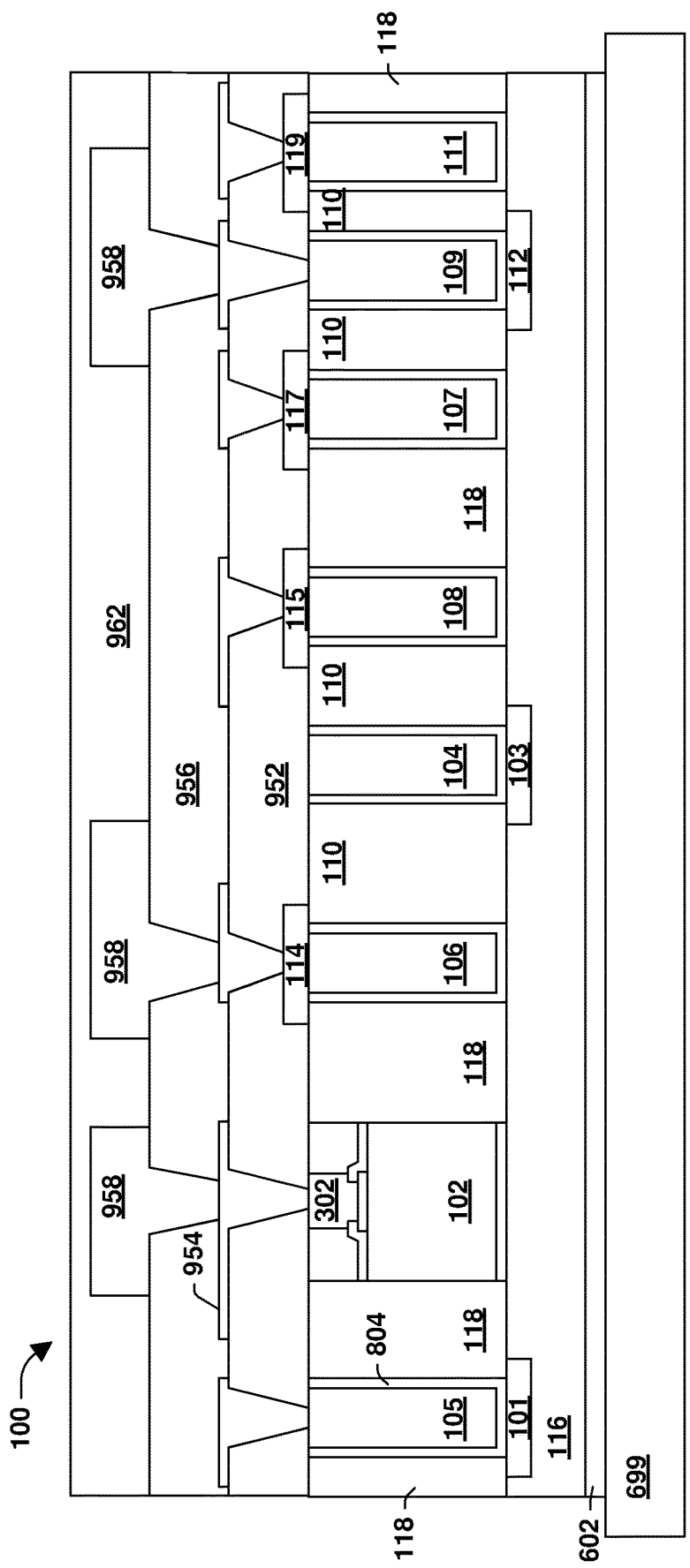

Referring to FIG. 19, an insulator layer 962 is formed, such as deposited, over the layer of conductive material 958 and exposed portions of the insulator layer 956. Some embodiments are implemented in which the insulator layer 962 comprises a polymeric material or other applicable materials. Some embodiments are implemented in which the insulator layer 962 comprises at least one of PI, PBO, or other applicable materials. Some embodiments are implemented in which the insulator layer 962 is deposited using spin coating or other applicable processes.

Figure 20:
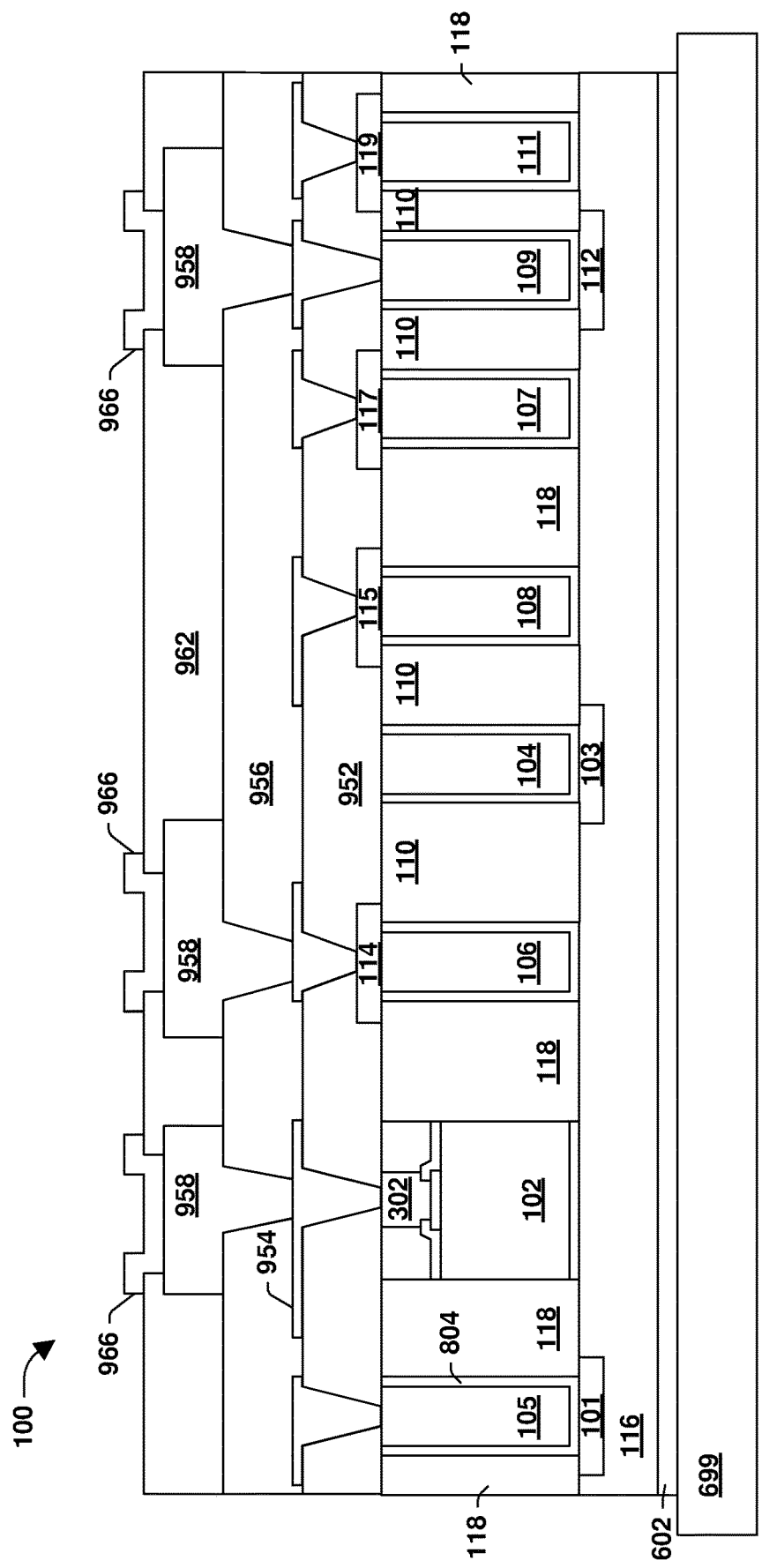

Referring to FIG. 20, the insulator layer 962 patterned, such as with a photoresist, to form openings that expose portions of the conducive material 958 and a conductive material 966 is formed, such as deposited, over portions of the insulator layer 962 and exposed portions of the conductive material 958. In some embodiments wet acid etching or other applicable processes are used to pattern the insulator layer 926. In some embodiments, the conductive material 966 comprises a metal, such as copper or other applicable materials. In some embodiments, a layer of conductive material is formed over the insulator layer 962 and exposed portions of the conductive material 958. The layer of conductive material is patterned to establish the elements of the conductive material 966 illustrated in FIG. 20.

Figure 21:
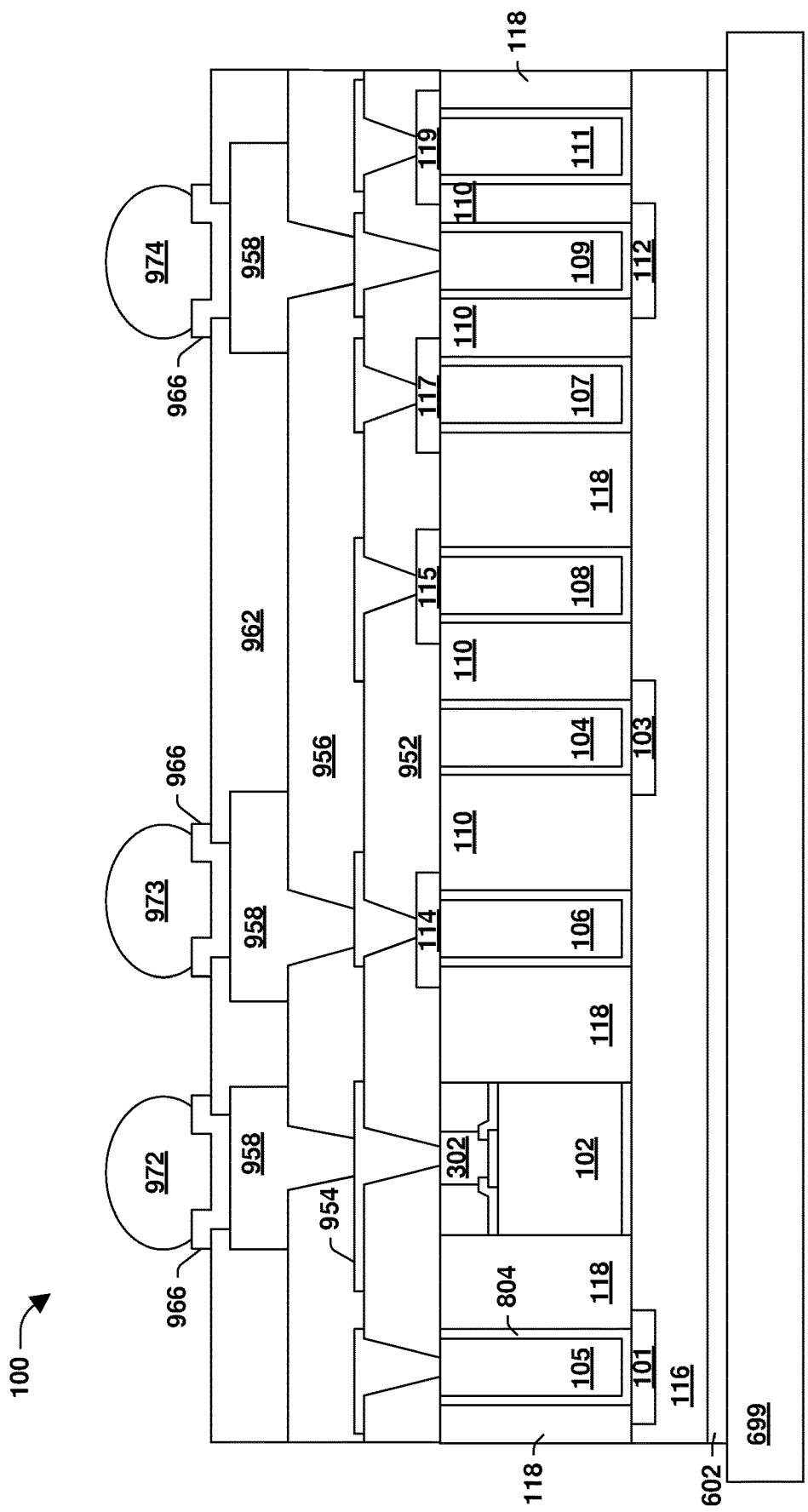

Referring to FIG. 21, conductive elements 972-974 are formed over the conductive material 966. In some embodiments, the conductive elements 972-974 are formed using a reflow process. In some embodiments, the conductive elements 972-974 comprise conductive metal, such as copper or other applicable materials. In some embodiments, conductive elements 972-974 have a spherical or spheroidal configuration.

Some embodiments are implemented in which the conductive elements 972-974 comprise ball structures. Some embodiments are implemented in which the conductive elements 972-974 comprise components of an under ball metal (UBM) structure. In some embodiments, the UBM structure comprises components of a ball grid array (BGA).

Figure 22:
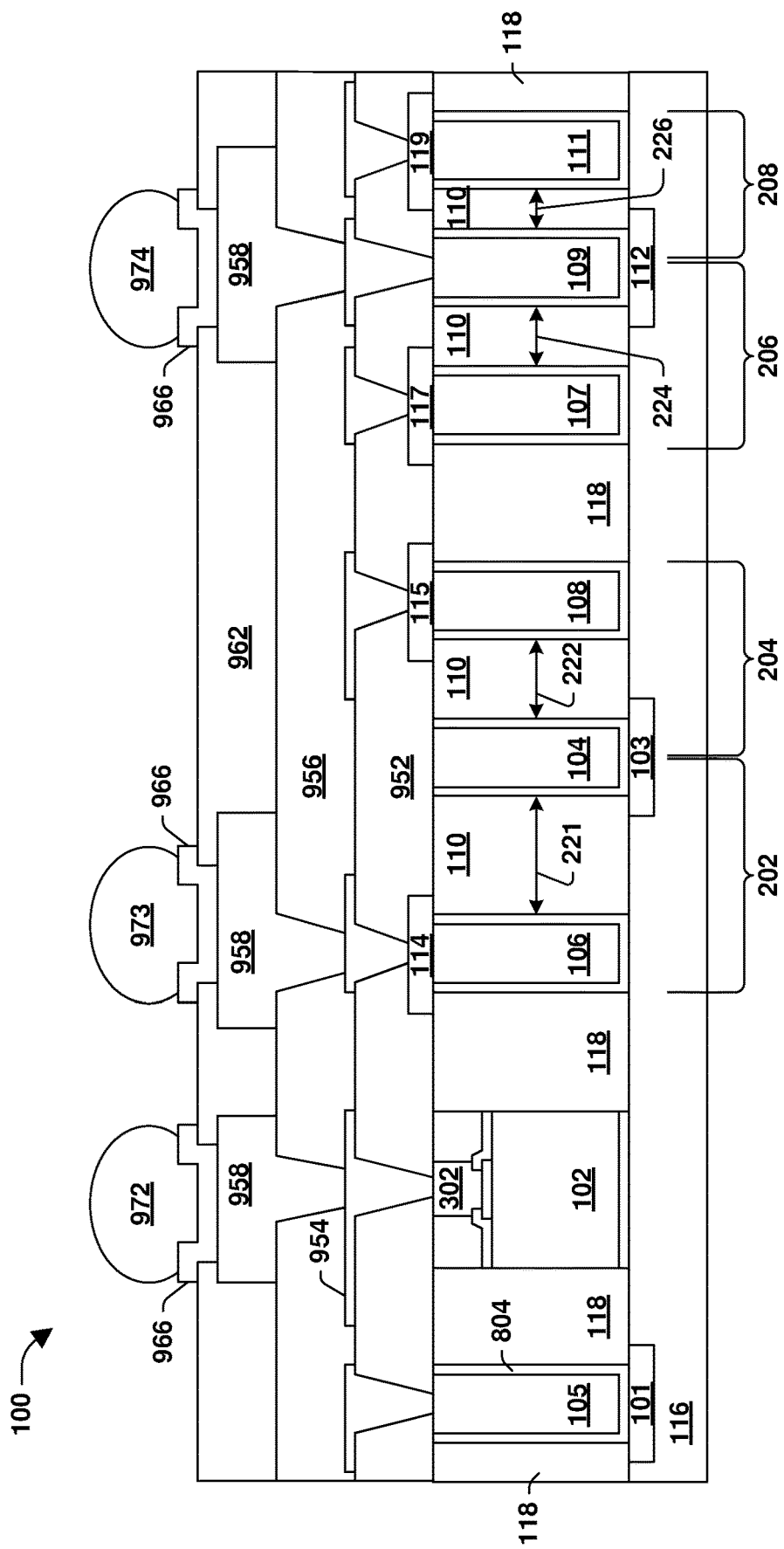

Referring to FIG. 22, the intermediate support medium 699 is removed from the insulator layer 116 to form a semiconductor arrangement 100. According to some embodiments, the thin layer 602 is illuminated or irradiated with electromagnetic radiation. In some embodiments, the electromagnetic radiation comprises light. In some embodiments, the electromagnetic radiation comprises ultraviolet light. Some embodiments are implemented in which the thin layer 602 is exposed to the electromagnetic radiation through the intermediate support medium 699. The irradiation or illumination of the thin layer 602 causes a change in at least one of a physical, chemical, or material property of the thin layer 602, such that the intermediate support medium 699 is removable from the insulator layer 116.

In accordance with some embodiments, the semiconductor arrangement 100 has at least two pairs of capacitors, where the first pair of capacitors has a first capacitor 202 and a second capacitor 204 and the second pair of capacitors has a third capacitor 206 and a fourth capacitor 208. According to some embodiments, more or fewer capacitors are comprised within the semiconductor arrangement 100. According to some embodiments, a vertical conductive structure of a capacitor is a vertical conductive plate. According to some embodiments, the vertical conductive structure is in a via layer of the semiconductor arrangement.

The first capacitor 202 is defined by the vertical conductive structure 106, the vertical conductive structure 104, and the dielectric material 110 between 106 and 104. According to some embodiments, the first capacitor 202 has a first capacitance based upon the first distance 221 between the vertical conductive structure 106 and the vertical conductive structure 104. According to some embodiments, the first capacitance of the first capacitor 202 is based upon a composition of the dielectric material 110 between 106 and 104. According to some embodiments, the first capacitance of the first capacitor 202 is based upon at least one of the height, thickness, or length of at least one of the vertical conductive structure 106 or the vertical conductive structure 104. According to some embodiments, the first capacitance of the first capacitor 202 is based upon at least one of the height, thickness, or length of the dielectric material 110 between the vertical conductive structure 106 and the vertical conductive structure 104.

The second capacitor 204 is defined by the vertical conductive structure 104, the vertical conductive structure 108, and the dielectric material between 104 and 108. According to some embodiments, the second capacitor 204 has a second capacitance based upon the second distance 222 between the vertical conductive structure 104 and the vertical conductive structure 108. According to some embodiments, the second capacitance of the second capacitor 204 is based upon a composition of the dielectric material 110 between the vertical conductive structure 104 and the vertical conductive structure 108. According to some embodiments, the second capacitance of the second capacitor 204 is based upon at least one of the height, thickness, or length of at least one of the vertical conductive structure 104 or the vertical conductive structure 108. According to some embodiments, the second capacitance of the second capacitor 204 is based upon at least one of the height, thickness, or length of the dielectric material 110 between 104 and 108.

The third capacitor 206 is defined by the vertical conductive structures 107 and 109 and the dielectric material 110 between 107 and 109. According to some embodiments, the third capacitor 206 has a third capacitance based upon the third distance 224 between the vertical conductive structure 107 and the vertical conductive structure 109. According to some embodiments, the third capacitance of the third capacitor 206 is based upon a composition of the dielectric material 110 between the vertical conductive structure 107 and the vertical conductive structure 109. According to some embodiments, the third capacitance of the third capacitor 206 is based upon at least one of the height, thickness, or length of at least one of the vertical conductive structure 107 or the vertical conductive structure 109. According to some embodiments, the third capacitance of the third capacitor 206 is based upon at least one of the height, thickness, or length of the dielectric material 110 between 107 and 109.

The fourth capacitor 208 is defined by the vertical conductive structures 109 and 111 and the dielectric material 110 between 109 and 111. According to some embodiments, the fourth capacitor 208 has a fourth capacitance based upon the fourth distance 226 between the vertical conductive structure 109 and the vertical conductive structure 111. According to some embodiments, the fourth capacitance of the fourth capacitor 208 is based upon a composition of the dielectric material 110 between the vertical conductive structure 109 and the vertical conductive structure 111. According to some embodiments, the fourth capacitance of the fourth capacitor 208 is based upon at least one of the height, thickness, or length of at least one of the vertical conductive structure 109 or the vertical conductive structure 111. According to some embodiments, the fourth capacitance of the fourth capacitor 208 is based upon at least one of the height, thickness, or length of the dielectric material 110 between 109 and 111.

In some embodiments, using the single photoresist 802 illustrated in FIG. 2 efficiently, economically, etc. fabricates at least some of the semiconductor arrangement 100. For example, the single photoresist establishes the first distance 221, the second distance 222, the third distance 224, and the fourth distance 226, where respective capacitances of capacitors are a function of these distances. The single photoresist also establishes dimensions, such as length, depth, height, width, etc., of openings 806, 223, 225, 227, 229, where dimensions of features, elements, etc. of the semiconductor arrangement are a function of the dimensions of these openings, and capacitances of capacitors of the semiconductor arrangement are a function of the dimensions of the features, elements, etc. of the semiconductor arrangement.

The semiconductor arrangement 100 having the different capacitors with respective capacitances is implemented in a circuit in some embodiments. Voltages are respectively applied to active device 102, the vertical conductive structure 106, and the vertical conductive structure 109 through the conductive element 972, the conductive element 973, and the conductive element 974, respectively. According to some embodiments, the voltage applied to the vertical conductive structure 106, such as through the conductive element 973, is also applied to at least one of the vertical conductive structures 108, 107, or 111, such as through one or more electrical connections (not shown) through layers 962, 956, and 952, or such as through one or more electrical connections (not shown) in layer 116 that connect at least one of the vertical conductive structures 106, 108, 107, or 111 to a different of the vertical conductive structures 106, 108, 107, or 111. According to some embodiments, the voltage applied to the vertical conductive structure 109, such as through the conductive element 974, is also applied to at least one of the vertical conductive structures 104 or 105, such as through one or more electrical connections (not shown) through layers 962, 956, and 952, or such as through one or more electrical connections (not shown) in layer 116 that connect at least one of the vertical conductive structures 104, 105, or 109 to a different of the vertical conductive structures 104, 105, or 109. According to some embodiments, the voltage applied to at least one of the vertical conductive structures 104, 105, or 109 is applied through at least one of the conductive elements 101, 103, or 112. According to some embodiments, the voltage applied to at least one of the active device 102 or at least one of the vertical conductive structures 106, 108, 107, or 111 is a supply voltage. According to some embodiments, the voltage applied to at least one of the vertical conductive structures 104, 105, or 109 is ground or zero volts. According to some embodiments, the voltage applied to at least one of the active device 102 or at least one of the vertical conductive structures 106, 108, 107, or 111 is ground or zero volts. According to some embodiments, the voltage applied to at least one of the vertical conductive structures 104, 105, or 109 is a supply voltage.

In some embodiments, the capacitors function to reduce or suppress electrical noise related to an operation of the active device 102. In some embodiments, the capacitors function to regulate a level of a voltage related to an operation of the active device 102.

Some embodiments are implemented in which the capacitors function as decoupling capacitors in relation to the active device 102. In some implementations, the capacitor function as decoupling capacitors for use with radio frequency (RF) transceiver (Tx/Rx) modules of, e.g., mobile and "smart" phones, pad style and other small form factor, lightweight or power efficient computing and communication devices, portable data terminal (PDT) and personal digital assistant (PDA) devices, or various commercial, industrial, technical and consumer electronic devices. In some implementations, the capacitors function as decoupling capacitors for use with System-on-Chip (SoC) and Array Processor (AP) electronics.

Some embodiments are implemented in which the capacitors comprise metal-insulator-metal capacitors (MiMCAP). In some implementations, the MiMCAPs are used for providing a decoupling capacitor (DeCAP) function with various uses. In some embodiments, the capacitors comprise a scalable set of MiMCAPs useful for various DeCAP applications.

In some embodiments, a single InFO or TIV configured MiMCAP set comprising the capacitors effectuate a sufficient DeCAP for use with a first "Internet-of-Things" (IOT) or RF Tx/Rx application. In some embodiments, two (2) InFO/TIV configured MiMCAP sets effectuate a sufficient DeCAP for use with a second IOT and RF Tx/Rx application. In some embodiments, five (5) MiMCAP InFO/TIV sets effectuate a sufficient DeCAP for use with a third IOT and RF Tx/Rx application.

In some embodiments, the semiconductor arrangement 100 conforms to a scalable metal-on-metal (MoM) structural configuration. In some embodiments, the MoM structure of the semiconductor arrangement 100 conforms to a square-type (square) InFO-TIV configuration. In some embodiments, the semiconductor arrangement 100 conforms to a vertically plated via or TIV electrodes arrayed in an InFO configuration.

Some embodiments are implemented in which a square InFO-TIV configuration is characterized with a significant aspect ratio. In some embodiments, the aspect ratio characterizing the square InFO-TIV configuration relates to an area corresponding to 'plates' of a capacitor, which are defined by the two vertical conductive structures of the capacitor. Relatively short interconnects characterize the conductive structures of the semiconductor arrangement and relate to rapid operational speed and low associated delay time.

According to some embodiments, a semiconductor arrangement is provided. The semiconductor arrangement includes a molding layer and a first capacitor. The first capacitor includes a first vertical conductive structure within the molding layer, a second vertical conductive structure within the molding layer, and a first high-k dielectric material between the first vertical conductive structure and the second vertical conductive structure.

According to some embodiments a method for fabricating a semiconductor arrangement is provided. The method includes placing an active device over an insulator layer. A first vertical conductive structure is formed over the insulator layer. A first opening is defined between the active device and the first vertical conductive structure. A second vertical conductive structure is formed over the insulator layer. A second opening is defined between the first vertical conductive structure and the second vertical conductive structure. A molding compound is formed in the first opening. A first dielectric material is formed in the second opening. A capacitor includes the first vertical conductive structure, the second vertical conductive structure, and the first dielectric material between the first vertical conductive structure and the second vertical conductive structure.

According to some embodiments a method for fabricating a semiconductor arrangement is provided. The method includes forming a photoresist over an insulator layer. The photoresist is patterned to define a first opening and a second opening. A first vertical conductive structure is formed in the first opening. A second vertical conductive structure is formed in the second opening. The photoresist is removed. Upon removing the photoresist, a third opening is defined between the first vertical conductive structure and the second vertical conductive structure. An active device is placed over the insulator layer. A fourth opening is defined between the first vertical conductive structure and the active device. A molding compound is formed in the fourth opening. A dielectric material is formed in the third opening. A capacitor comprises the first vertical conductive structure, the second vertical conductive structure, and the dielectric material between the first vertical conductive structure and the second vertical conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
a molding layer;
a first capacitor, comprising:
a first vertical conductive structure within the molding layer;
a second vertical conductive structure within the molding layer; and
a first high-k dielectric material between the first vertical conductive structure and the second vertical conductive structure, wherein:
the first high-k dielectric material is different than a material of the molding layer, and
the molding layer is in direct contact with the first high-k dielectric material; and
a second capacitor, comprising:
a third vertical conductive structure, wherein a first portion of the molding layer is between the second vertical conductive structure and the third vertical conductive structure.

2. The semiconductor arrangement of claim 1, comprising a third capacitor comprising:
the first vertical conductive structure;
a fourth vertical conductive structure within the molding layer; and
a second high-k dielectric material between the first vertical conductive structure and the fourth vertical conductive structure.

3. The semiconductor arrangement of claim 2, wherein the first high-k dielectric material is different than the second high-k dielectric material.

4. The semiconductor arrangement of claim 2, wherein a width of the first high-k dielectric material is different than a width of the second high-k dielectric material.

5. The semiconductor arrangement of claim 1, comprising an active device within the molding layer, wherein the active device is spaced apart from the first vertical conductive structure by a second portion of the molding layer.

6. The semiconductor arrangement of claim 1, comprising a conductive element underlying the first vertical conductive structure.

7. The semiconductor arrangement of claim 6, comprising an insulator layer under the first vertical conductive structure, wherein the conductive element is embedded in the insulator layer.

8. The semiconductor arrangement of claim 1, wherein the second capacitor comprises:
a fourth vertical conductive structure within the molding layer, wherein the third vertical conductive structure is between the second vertical conductive structure and the fourth vertical conductive structure; and
a second high-k dielectric material between the third vertical conductive structure and the fourth vertical conductive structure.

9. The semiconductor arrangement of claim 8, wherein the first vertical conductive structure and the fourth vertical conductive structure are coupled to a first voltage source.

10. The semiconductor arrangement of claim 1, wherein the first vertical conductive structure and the third vertical conductive structure are coupled to a first voltage source.

11. The semiconductor arrangement of claim 1, comprising:
a first insulator layer under the first vertical conductive structure and the second vertical conductive structure and in contact with the second vertical conductive structure; and
a second insulator layer over the first vertical conductive structure and the second vertical conductive structure and in contact with the first vertical conductive structure.

12. The semiconductor arrangement of claim 1, comprising:
an active device within the molding layer; and
a second high-k dielectric material, wherein the active device is spaced apart from the first vertical conductive structure by a second portion of the molding layer and the second high-k dielectric material.

13. A semiconductor arrangement, comprising:
a molding layer;
a first capacitor, comprising:
a first vertical conductive structure within the molding layer;
a second vertical conductive structure within the molding layer; and
a first high-k dielectric material between the first vertical conductive structure and the second vertical conductive structure, wherein the first high-k dielectric material is different than a material of the molding layer; and
a second capacitor, comprising:
a third vertical conductive structure, wherein:
the third vertical conductive structure and the first vertical conductive structure are coupled to a first voltage source, and
the second vertical conductive structure is between the first vertical conductive structure and the third vertical conductive structure; and
a fourth vertical conductive structure between the second vertical conductive structure and the third vertical conductive structure.

14. The semiconductor arrangement of claim 13, wherein the second capacitor comprises a second high-k dielectric material between the third vertical conductive structure and the fourth vertical conductive structure.

15. The semiconductor arrangement of claim 13, wherein the second vertical conductive structure and the fourth vertical conductive structure are coupled to a second voltage source different than the first voltage source.

16. The semiconductor arrangement of claim 13, comprising:
a third capacitor, comprising:
the third vertical conductive structure; and
a fifth vertical conductive structure, wherein the third vertical conductive structure is between the fourth vertical conductive structure and the fifth vertical conductive structure.

17. A semiconductor arrangement, comprising:
a molding layer;
an active device; and
a first capacitor spaced apart from the active device by the molding layer, wherein the first capacitor comprises:
a first vertical conductive structure within the molding layer;
a second vertical conductive structure within the molding layer; and
a first high-k dielectric material between the first vertical conductive structure and the second vertical conductive structure, wherein:
the first high-k dielectric material is in direct contact with the molding layer, and
the first high-k dielectric material is different than a material of the molding layer.

18. The semiconductor arrangement of claim 17, comprising:
a second capacitor, comprising:
a third vertical conductive structure;
a fourth vertical conductive structure; and
a second high-k dielectric material, wherein a first portion of the molding layer is between the second vertical conductive structure and the third vertical conductive structure.

19. The semiconductor arrangement of claim 17, comprising:
a second capacitor, comprising:
the second vertical conductive structure;
a third vertical conductive structure; and
a second high-k dielectric material between the second vertical conductive structure and the third vertical conductive structure.

20. The semiconductor arrangement of claim 13, wherein the first high-k dielectric material is in direct contact with the molding layer.

* * * * *